United States Patent [19]

Maurice

[11] Patent Number: 4,790,630
[45] Date of Patent: Dec. 13, 1988

[54] ACTIVE MATRIX DISPLAY SCREEN WITH DRAIN RESISTANCE AND PROCESSES FOR PRODUCING THIS SCREEN

[76] Inventor: François Maurice, 125 Boulevard de la Corniche, 22700 Perros Guirec, France

[21] Appl. No.: 7,091

[22] Filed: Jan. 27, 1987

[30] Foreign Application Priority Data

Jan. 27, 1986 [FR] France ............................. 86 01082

[51] Int. Cl.$^4$ ...................... G02F 1/133; G09G 3/36
[52] U.S. Cl. .................................... 350/334; 350/333;
357/23.7; 340/784; 156/651; 156/656;
156/659.1; 437/181; 437/50; 437/60
[58] Field of Search ............... 350/332, 333, 334, 336;
340/784, 713; 357/28.7, 45, 41; 156/651, 661.1,
656, 659.1; 427/259, 264, 266, 269, 402; 437/50,
60, 193–195

[56] References Cited

U.S. PATENT DOCUMENTS

| 4,112,333 | 9/1978 | Asars et al. | 340/784 |
| 4,115,799 | 9/1978 | Luo | 357/23.7 |
| 4,545,112 | 10/1985 | Holmberg et al. | 437/195 |
| 4,563,806 | 1/1986 | Coissard et al. | 437/54 |
| 4,689,116 | 8/1987 | Coissard et al. | 350/333 |
| 4,697,331 | 10/1987 | Boulitrop et al. | 350/336 |
| 4,704,559 | 11/1987 | Suginoya et al. | 350/334 |
| 4,705,358 | 11/1987 | Yamazaki et al. | 350/334 |

FOREIGN PATENT DOCUMENTS

| 0209113 | 1/1987 | European Pat. Off. | 350/334 |
| 0205737 | 11/1984 | Japan | 350/336 |
| 0235468 | 11/1985 | Japan | 357/4 |

*Primary Examiner*—Stanley D. Miller
*Assistant Examiner*—Tai Van Duong
*Attorney, Agent, or Firm*—Oblon, Fisher, Spivak, McClelland & Maier

[57] ABSTRACT

Active matrix display screen and processes for producing it. Each block (51) is associated with a conductive strip (55) connecting the drain of the control transistor (61) to the addressing column. The addressing line is narrower at the intersection of a column than in the zone of the transistor and the isolation of the intersection can be different from the isolation of the gate.

5 Claims, 3 Drawing Sheets

ACTIVE MATRIX DISPLAY SCREEN WITH DRAIN RESISTANCE AND PROCESSES FOR PRODUCING THIS SCREEN

This invention has as its object an active matrix display screen with drain resistance and processes for producing this screen.

An active matrix display screen generally comprises two plates between which is inserted an electrooptical material such as a liquid crystal. On one of the plates is a matrix of transparent conductive blocks, thin-film transistors, a family of conductive addressing lines and a family of conductive addressing columns. Each transistor has a gate connected to a line, a source connected to a block and a drain connected to a column. On the second plate is a counterelectrode.

Figure 1:
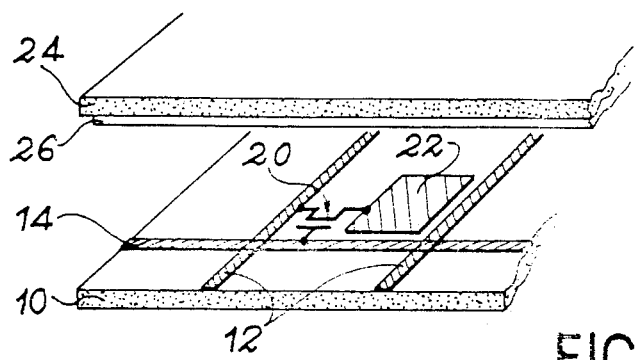

Such a structure is shown in FIG. 1. Represented there in a simplified manner is a lower plate 10 carrying conductive columns 12 and conductive lines 14, a transistor 20, a conductive block 22 and an upper plate 24 covered with a counterelectrode 26.

Figure 2:
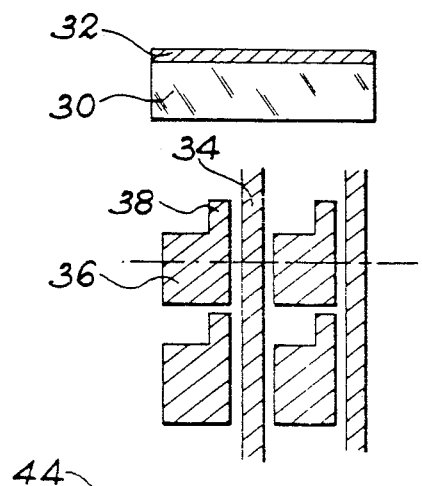

To obtain such a structure, a process can be used whose main stages are illustrated in FIG. 2. This process comprises the following operations:

preparation of a glass substrate 30 by physicochemical cleaning;

depositing of a layer 32 of transparent conductive material, for example of indium and tin oxide (ITO) (a);

a first photoengraving, to give layer 32 the shape of columns 34 and of blocks 36 provided with a rectangular appendix 38 (b);

depositings of a hydrogenated amorphous silicon layer 40, a silica layer 42 and an aluminum layer 44, each depositing being made at about 250° C. (c);

a second photoengraving, to define lines 46 overlapping appendices 38 and intersecting the columns and defining transistors (d);

general passivation by depositing of a $SiO_2$ layer (not shown).

Such a process, with two masking levels, is described in French patent application FR-A No. 2 533 072.

Despite its simplicity, this process exhibits drawbacks:

first of all, in case of a drain-gate short circuit of a transistor, an entire column is short-circuited with a line, then, the width of a line, in the zone where it intersects a column, is determined by the width of the channel of the transistor, so that it cannot be reduced at will to reduce the line-column short-circuit risks, finally, the thickness of the insulating material which separates a line and a column, by the very design, like that of the insulating material is located under the gate of the transistor, so that there is no control, there either, of the increase of this thickness for reducing the short-circuit risks.

The aim of the invention is precisely to remedy these drawbacks. For this purpose, the invention specifies the use of an auxiliary strip of conductive material exhibiting a certain resistivity, this strip being placed beside each block. Each transistor is then formed in the overlapping zone of a line with this strip and with the appendix connected to the block. Moreover, each strip is connected to a column. All the drawbacks listed above are then eliminated:

in case of drain-gate short circuit, the resistance exhibited by the strip avoids the complete short circuit between the line and the column, the drain of the transistor is no longer formed by the column, so that there is independence between the transistors and the zones of line-column intersections: the width of the line can be reduced at its passage over the columns without thereby reducing this width at the level of the gates of the transistors; the thickness of the insulating material separating lines and columns can also be given a larger value than the thickness of the insulating material under the gate of the transistors.

Another advantage can be added to this list. In a patent application filed by this applicant the same day as this application, an active matrix display screen is described in which the lines and/or columns are connected together by a resistance. This arrangement makes it possible to avoid the drawbacks connected with line or column breaks. Actually, in case of breaking, the isolated part is brought to a potential equal to the half-sum of the potentials of the adjacent lines or columns. But such an arrangement assumes that the columns exhibit a resistance that is not too high, which unfortunately is not the case with the process of the prior art where the material constituting the columns is the same as the material constituting the blocks, i.e., in practice, ITO. With the invention, the greatest latitude is left for the making of the columns, which makes it possible to use less resistive materials. The technique in question can then be used.

Specifically, this invention therefore has as its object an active matrix display screen comprising a first plate coated with a matrix of conductive blocks, thin-film transistors, a family of conductive addressing lines, and a family of conductive addressing columns, each transistor having a gate connected to a line, a source formed by an appendix connected to a block and a drain connected to a column, this screen further comprising a counterelectrode and an electrooptical material inserted between the two walls, this screen being characterized by the fact that each drain-column connection is made by a conductive strip exhibiting a certain resistance, the drain of each transistor being formed by the part of this strip located in the zone where a line overlaps this strip and wherein each line has a certain width in the zone where the transistors are formed and another width, smaller than the first, in the zone where it intersects itself.

This invention also has as its object processes for making a screen such as has just been defined.

Figure 3:
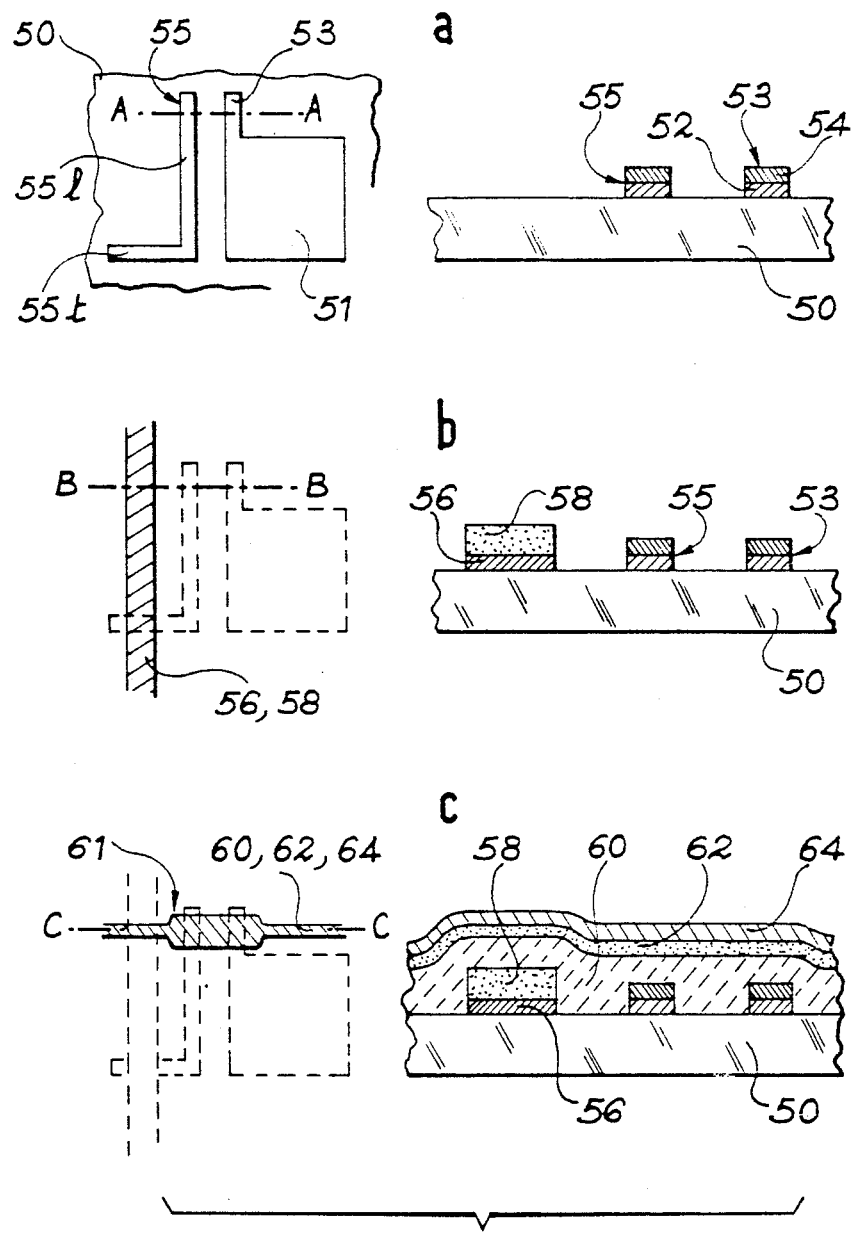
Figure 4:
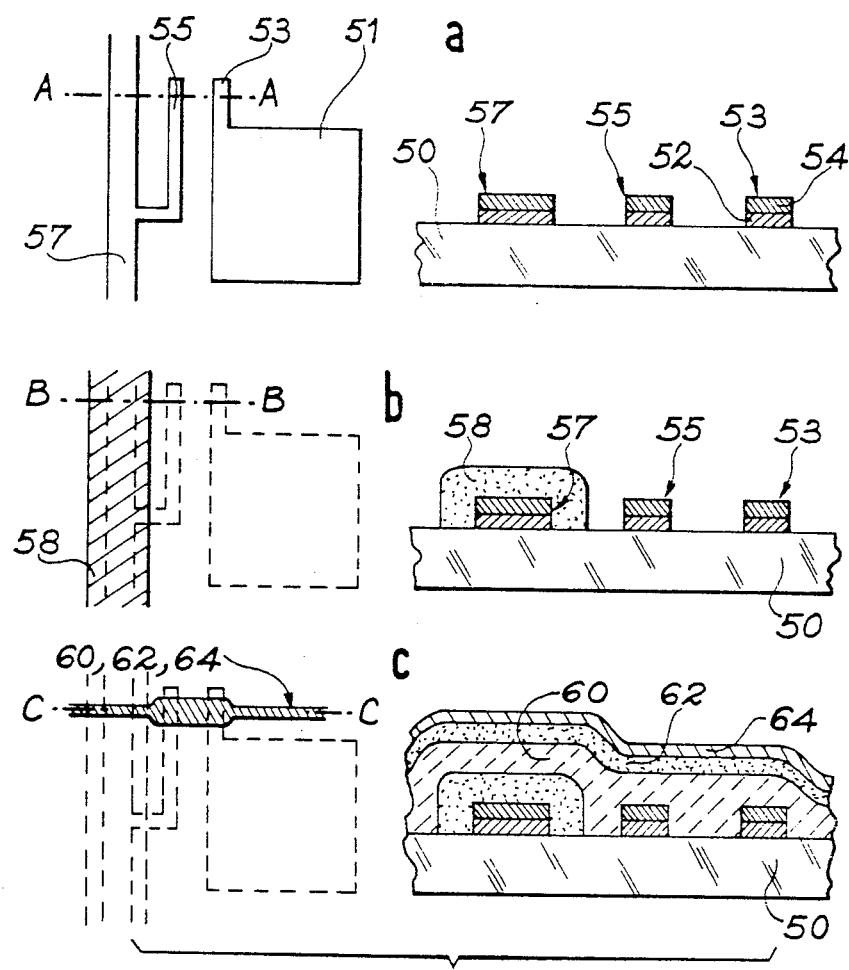
Figure 5:
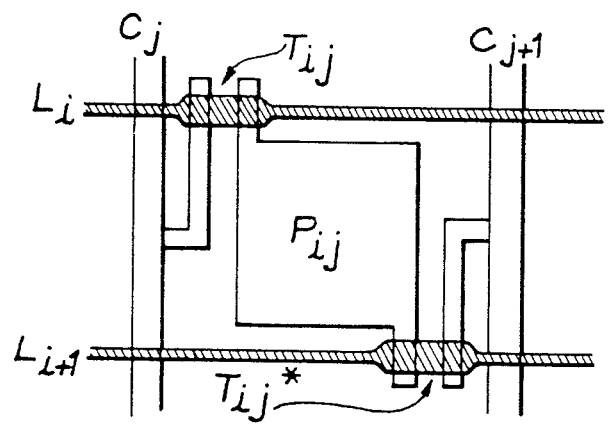

In any case, the characteristics of the invention will come out better on reading the following description of examples of embodiment given by way of explanation and that are in no way limiting. This description refers to the accompanying drawings in which:

FIG. 1, already described, shows the structure of an active matrix display screen, according to the prior art, FIG. 2, already described, illustrates a known production process used to produce an active matrix display screen, FIG. 3 shows a first method of using the process of the invention, FIG. 4 shows a second method of using the process of the invention, FIG. 5 illustrates a variant with dual control transistor.

In FIGS. 3 and 4 which will be described, the left part represents top views and the right part sections along AA, BB and CC, respectively.

In FIG. 3, three stages (a, b, c) of a first method of using the process according to the invention are seen.

The operations performed are as follows:

depositing on an insulating substrate 50, for example of glass, of a layer of a transparent conductive material 52, for example of indium and tin oxide ITO and, optionally, of an n+ doped amorphous silicon layer 54, a first photoengraving of this layer or these layers to form blocks 51 having an appendix 53 and strips 55 having a longitudinal part 55*l* which goes along the side of a block and the appendix and a transverse part 55*t* at right angles (part a) with the base of the strip, depositing of a layer 56 of a first metal and of a layer of a first insulating material 58, a second photoengraving applied to these two layers to lay out columns overlapping the transverse part of the strips, which connects the columns to the strips (part b), this second photoengraving leaving intact the layers of Si n+ and ITO.

depositing of a stack made of a layer 60 of hydrogenated amorphous silicon aSi:H, a layer 62 of a second insulating material and a layer 64 of a second metal, a third photoengraving applied to the preceding stack to form lines that overlap the appendices of the blocks and the upper end of the strips; in these overlapping zones transistors 61 are formed; this third photoengraving leaves the first insulating material intact. The width of the lines can be larger in the zone of the transistors than in the zones of intersection with the columns (as is seen in part c).

In practice, the first and second insulating materials can be both silica $SiO_2$ and the first and second metals of aluminum.

It can be seen, in this example, that all the aims pursued by the invention are reached:

strip 55 constitutes a resistance which protects the column if the transistor breaks down. If the ITO makes $10^4 \Omega$ per square and if the strip makes 10 squares (5 $\mu m \times 50$ $\mu m$), then this resistance is 100 k$\Omega$; it does not create a potential drop greater than 0.1V when the transistor is conducting, the line is of smaller width on the column than on the transistor, the gate insulating material and the intersection insulating material are of different thickness and possibly of a nature.

Moreover, the transistor is identical with that of the structures obtained by the process described in document FR-A No. 2 533 072 already cited with all the resultant qualities.

If it is desired to combine this invention with the arrangement protected in the simultaneous applications of the same inventor mentioned above, it is enough, during the first masking level, to add an ITO rectangle that goes around the plate and to prevent, at the 3rd masking level, the depositing of aSI:H and $SiO_2$ on the right and left ends of this rectangle, so that a contact can be made with the second metal. The lines and columns will then be connected together by strips of ITO at the periphery of the device.

FIG. 4 illustrates a slightly different process which comprises the following operations:

on an insulating substrate 50, depositing of a layer 52 of transparent conductive material (for example of ITO) and optionally of a layer 54 of n+ doped amorphous silicon, a first photoengraving to lay out blocks 51 provided with an appendix 53, columns 57 and strips 55 connected to the columns, depositing of a layer 58 of a first insulating material, a second photoengraving applied to this insulating material without touching the n+ Si or the ITO, to form insulating columns covering the conductive columns; the width of the insulating material is preferably larger than that of the metal of the column, so that the insulating material goes beyond the column and insulates it completely, depositing of a stack consisting of a layer 60 of aSi:H, a layer 62 of a second insulating material and a layer 64 of a second metal, a third photoengraving of the preceding stack saving the ITO and, optionally, the first insulating material, to lay out lines passing over the appendices and over the upper part of the strips. As in the preceding variant, the width of the line is preferably narrower at the intersection of the columns than on the transistors.

The drawback of this solution is that the material constituting the columns is ITO; its resistance is therefore great, which is incompatible with the arrangement protected by the application mentioned above and filed by this applicant. On the other hand, the insulation of the columns is excellent.

In the two processes which have just been described, it will be observed that the geometry of the transistors is not very sensible for the alignment of the mask used for the third photoengraving, because the line which defines the transistor overlaps two elongated strips (the appendix and the upper end of the strip for connection to the column), which allows uncertainties concerning the position of the mask.

In the second variant of the process, illustrated in FIG. 4, there can be deposited on the ITO, before the n+ Si an additional metal layer which will be engraved at the same time as the n+ Si during the third engraving operation. The advantage of this variant is to lead to columns with double conductive layers (ITO and metal), which reduces their resistance.

In the preceding, each block is provided with a single appendix and is controlled by a single transistor. But the invention can be quite strongly applied in the case where each block is provided with two appendices and is controlled by two transistors, as illustrated in FIG. 5. Block $P_j$ is controlled by transistor $T_{ij}$ connected to line $L_i$ and to column $C_j$ and by transistor $T_{ij}^*$ connected to line $L_{i+1}$ and to column $C_{j+1}$. There is thus obtained a redundancy which can be useful in case of defect at the level of a transistor. If the two transistors are operating, the picture displayed is finally offset by a step to the left and upward.

In conclusion, it can be indicated that this invention can be combined with another arrangement which is the object of another patent application filed the same day as the filing of this application and which specifies the use of a resistive layer under the gate of the transistor. If these two arrangements are combined, two protective resistances in series are obtained which effectively protect the screen against gate-drain short circuits.

I claim:

1. Active matrix display screen comprising a first plate (10) coated with a matrix of conductive blocks (22), thin-film transistors (20), a plurality of conductive addressing lines (14) and a plurality of conductive addressing columns (12), each transistor (20) having a gate connected to an addressing line, a source formed by a projection connected to one of said blocks and a drain connected to a column, said screen further having a second plate (24) comprising a counterelectrode (26) and an electrooptical material inserted between the two plates, said screen being characterized by the fact that each draincolumn connection is made by a strip (55) of conductive material exhibiting a certain resistance, the drain of each transistor being formed by the part of the strip located in the zone where an addressing line overlaps said strip and wherein each addressing line has a certain width in the zone where the transistors are formed and another width smaller than the first, in the zone where said strip intersects an addressing column.

2. Display screen according to claim 1, wherein said conductive strip (55) exhibiting a certain resistance consists of the same material as that (52) which constitutes the conductive blocks.

3. Display screen according to claim 2, wherein said material is indium-tin oxide (ITO).

4. Process for producing an active matrix display screen according to claim 1, said process consisting of forming a first plate (10) carrying first capacitor plates of capacitors (22), thin-layer transistors (20), conductive addressing lines (14) and columns (12), and forming an upper plate (24) coated with an counterelectrode (26) forming a second capacitor plate of the capacitors, said process being characterized by the fact that, to form the lower plate, the following operations are performed:

depositing on a insulating substrate (50) of a layer of a first conductive material (52, 54), a first photoengraving applied to said layer to constitute blocks (51) forming one of the capacitor plates of the future capacitors, each block having a projection (53), said first photoengraving further allowing to subsist a strip (55) having a longitudinal part (55*l*) which goes along the block and its projection and a transverse part (55*t*), depositing of a layer of a second conductive material (56) and of a layer of a first insulating material (58), a second photoengraving applied to said two latter layers to allow parallel columns to subsist at the longitudinal part (55*l*) of the strips and in contact with the transverse part (55*t*) of said strips, depositing of a stack made up of a layer (60) of hydrogenated amorphous silicon, a layer (62) of a second insulating material, a layer (64) of a third conductive material, a third photoengraving applied to addressing line stack to allow lines to subsist, addressing lines passing over said projections (53) of the blocks and over the end of the strips (55) and forming transistors there, the width of said addressing lines being able to be larger in the area of the transistors than it is in the areas where they intersect the columns.

5. Process for producing an active matrix display screen according to claim 1, said process consisting of forming a first plate (10) carrying first capacitor plates of capacitors (22), thin layer transistors (20), conductive addressing lines (14) and columns (12), and forming an upper plate (24) coated with an counterelectrode (26) forming a second capacitor plate of the capacitors, said process being characterized by the fact that, to form the lower plate, the following operations are performed:

depositing on an insulating substrate (50) of a layer of a first conductive material (52, 54), a first photoengraving applied to said layer to constitute blocks (51) forming one of the capacitor plates of the future capacitors, each block having a projection (53), said first photoengraving further allowing to subsist a strip (55) having a longitudinal part (55*l*) extending along the block and its projection and a transverse part (55*t*) and columns (57) in contact with the transverse part of the strips, depositing of a layer of a fist insulating material (58), a second photoengraving applied to said insulating layer to leave said insulating material on the columns, depositing of a stack made up of a layer (60) of hydrogenated amorphous silicon, a layer (62) of a second insulating material, a layer (64) of a third conductive material, a third photoengraving applied to addressing line stack to allow lines to subsist, addressing lines passing over said projections (53) of the blocks and over the end of the strips (55) and forming transistors there, the width of said addressing lines being able to be larger in the area of the transistors than it is in the areas where they intersect the columns.

* * * * *